July 3, 1962 W. MINNER ET AL 3,042,870

HIGH FREQUENCY TRANSISTOR OSCILLATOR

Filed Nov. 7, 1958 2 Sheets-Sheet 1

INVENTORS:

WILLY MINNER and HEINZ RINDERLE

BY

PATENT AGENT

July 3, 1962 W. MINNER ET AL 3,042,870

HIGH FREQUENCY TRANSISTOR OSCILLATOR

Filed Nov. 7, 1958 2 Sheets-Sheet 2

INVENTORS:
WILLY MINNER
and HEINZ RINDERLE
BY Eric D. Frankel
PATENT AGENT

United States Patent Office 3,042,870

Patented July 3, 1962

3,042,870

HIGH FREQUENCY TRANSISTOR OSCILLATOR

Willy Minner and Heinz Rinderle, Ulm (Danube), Germany, assignors to Telefunken G.m.b.H., Berlin, Germany Filed Nov. 7, 1958, Ser. No. 772,464
Claims priority, application Germany Nov. 15, 1957
9 Claims. (Cl. 325—451)

The present invention relates to very high frequency transistor oscillators and, more particularly, to a circuit for providing regenerative feedback while, at the same time, cancelling the phase shift in the transistors caused by internal reactances.

In the circuits heretofore known, employing a transistor in an oscillator for very high frequencies, for example, for ultra short waves, it has been difficult to produce oscillations or to maintain the same over a continuously tunable range, as required, for example, in an ultra short wave broadcast receiver. This is due to the great frequency dependence on the characteristic of the transistor, particularly its slope or steepness. At this frequency, the phase shift in some of the transistors known today, amounts to about −90°, and the phase shift increases approximately linearly with the frequency.

An oscillator circuit employing a transistor having a grounded base has been known in which, for the purpose of compensating the phase shift in the transistor of, for example, 90°, a corresponding phase shift in feedback current is obtained by connecting the terminal of the condenser of the collector oscillating circuit, other than the terminal which is connected to the collector, with the emitter rather than with the coil of this oscillating circuit (see British Patent No. 754,713). This circuit operating without a feedback coil has the disadvantage that the low input resistance of the transistor is connected in series in the collector oscillating circuit and, correspondingly, damps the latter, whereby the frequency stability is decreased and the excitation of oscillations is impaired.

It is an object of the present invention to avoid this disadvantage.

It is another object of the invention to design the feedback coil of the transistor oscillator, which oscillator operates at such high frequencies that, due to the transistor characteristics, the phase shift between the input voltage and the output current of the transistor is between −60° and −120°. The coil is connected to the base or to the emitter, and is selected to be so large that, together with the shunted effective capacity of the transistor, it forms an oscillating circuit which is inductively coupled to the collector of the oscillator in a relative polarity which is reversed with respect to the normal polarity, and/or capacitively coupled, whereby the resonant frequency of this circuit is so close to the oscillator frequency, that the phase angle of the feedback voltage together with the phase angle of the characteristic curve result in the phase rotation of 180° required for the optimum generation of oscillations. Thus, the feedback oscillating circuit and the collector oscillating circuit form together a band filter with inductive or capacitive or mixed coupling, said band filter shifting the phase at the resonant frequency of the secondary circuit of the transmitted voltage by about 90° and, in case of a deviation from the resonant frequency, shifting the phase in one or the other direction about more or less than 90°.

The circuit according to the invention differs from the known circuits in two respects. Only a small portion of the reactive current of the collector oscillating circuit is used for the feedback. As a result of this, the feedback energy is decreased, so that it may not be sufficient under certain circumstances to sustain oscillation. This difficulty is overcome, according to the invention, in case of capacitive feedback by shunting an inductance in parallel with the base emitter circuit, said inductance being designated in the foregoing as a feedback coil. By suitably designing the inductance, it is possible in case of inductive, capacitive or mixed feedback, to provide optimum phase shift in the feedback branch at a given frequency independent to a great extent of the characteristic of the transistor. In contrast to this, the known circuit has the disadvantage above-mentioned, of an inferior frequency stability, and in addition to this, the optimum phase shift in the feedback branch is present only at a frequency determined by the transistor itself.

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

Figure 1:
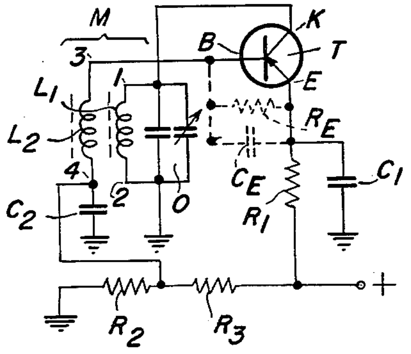
FIGURES 1 and 2 are circuit diagrams showing transistor oscillators, respectively, of the grounded emitter type and of the grounded base type according to the invention.

The circuit of FIGURE 1 comprises a transistor T having an emitter E, a collector K and a base B. A resistance $R_1$ of, for example, 500 ohms with a bypass condenser $C_1$ of, for example, 1000 mircromicrofarad, serves to stabilize the transistor current in a known manner, and a voltage divider $R_2$, $R_3$ of, for example, 15,000 ohms and 5,000 ohms, respectively, serves to adjust the D.C. operating point of the transistor. A condenser $C_2$ of, for example, 1000 micromicrofarad, by-passes the lower end of a coil $L_2$ to ground with respect to high frequency currents. The collector K is connected to the oscillator circuit O, including an inductance $L_1$. The latter is coupled with the coupling coil $L_2$ which is loaded with an internal input impedance comprising resistance $R_E$ of the transistor, said internal resistance having a relatively low value and having a capacitive component denoted by $C_E$ in the drawing.

Figure 3:
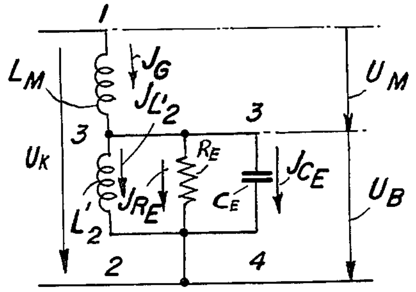
FIGURE 3 is an equivalent circuit diagram.
Figure 4:
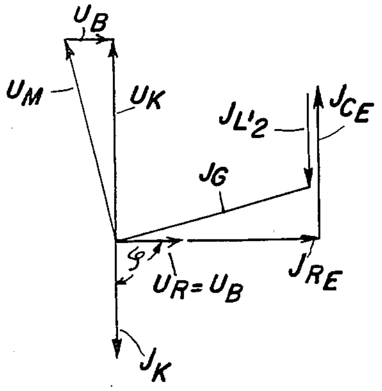
FIGURE 4 is a vector diagram illustrating the conditions in the aforementioned circuits.

FIGURE 3 shows the feedback branch whereby for the sake of clarity, the equivalent input circuit diagram is represented as a $\pi$-member. The series inductance is obtained as $$L_M = \frac{M(1-k^2)}{k^2}$$

and the output shunt inductance is obtained as $$L_2' = L_2 \frac{1-k^2}{1-k\sqrt{\frac{l^2}{L_1}}}$$

wherein M represents the mutual inductance of the transformer and $k$ the coupling factor. The compensation of the phase angle will be explained with reference to the vector diagram of FIGURE 4, as follows:

In accordance with the present invention, the feedback voltage $U_R$ is to be in phase with the voltage between the base and the emitter $U_B$, and this voltage $U_B$ is the starting point of this explanation. The voltage $U_B$ produces a collector current $J_K$, in this example lagging behind the voltage $U_B$ by 90°, due to the phase angle of the slope $\varphi$. The voltage $U_K$ is in phase opposition to the collector current $J_K$ at the resonant frequency $f_0$ of the oscillator. As shown in the equivalent diagram of FIGURE 3, the voltage $U_K$ consists of the voltages $U_B$ and $U_M$. The latter voltage $U_M$ produces a current $J_G$ which lags behind the voltage $U_M$ by 90° (see FIGURE 4), due to the shunt circuit $L_2'$, $R_E$ and $C_E$ (see FIGURE 3). The current $J_G$ is divided into component currents $-J_{L'2}$, $J_{CE}$ and $J_{RE}$. If the coil $L_2$ is designed in accordance with the invention, and with a given capacitive reactance component $C_E$, the current $J_{RE}$ is in phase with the voltage $U_B$ and, therefore, the feed back voltage $U_R$ is in phase with the voltage $U_B$. A change of the phase during tuning over a certain frequency range is compensated for by varying the phase condition of the oscillator circuit, so that it is possible to tune the ultra short wave broadcast range with an approximately constant oscillating amplitude. Adjusting the phase shift to suit individual transistors is accomplished by varying the inductance $L_2$.

Figure 2:
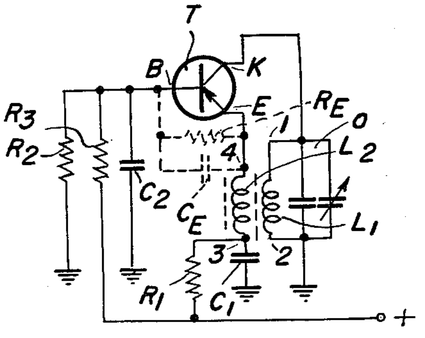

Another oscillator embodiment according to the invention is shown in FIGURE 2, wherein the same circuit components are used as in FIGURE 1 for stabilizing the current and adjusting the D.C. operating point. In contrast to FIGURE 1, the oscillator in FIGURE 2 operates in a circuit of the grounded base type. Therefore, the base electrode is grounded via the condenser $C_2$ of, for example, 150 micromicrofarads, and the coil $L_2$ is inserted between the emitter E and $R_1$ and $C_1$. In accordance with the invention, the inductance $L_1$ is coupled to the coil $L_2$ via mutual coupling M. However, the terminals of the inductance $L_2$ are reversed 180° in view of the phase relations between emitter E and collector K.

Figure 5:
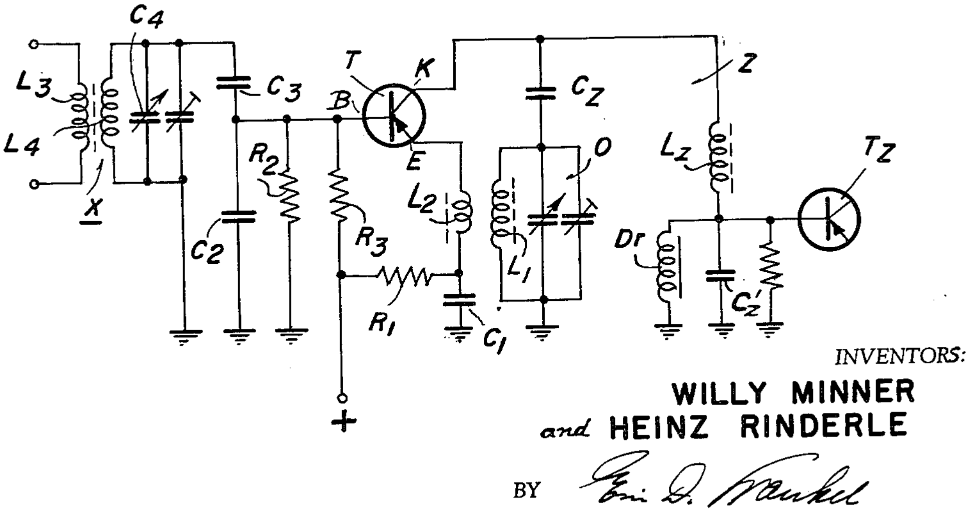
FIGURE 5 illustrates in a circuit diagram the application of the transistor oscillator to a self-oscillating mixing stage.

FIGURE 5 shows a self-oscillating continuously tunable mixing stage for an ultra short wave range using the circuit according to FIGURE 2, wherein the same circuit components are used for current stabilization and for the oscillator circuit. In addition to this, an input circuit X, comprising an antenna coupling coil $L_3$ and a resonant inductance $L_4$ and tuning condenser $C_4$ are connected to the base electrode B. This input is matched to the input resistance of the transistor T via the condenser $C_3$ of, for example, 20 micromicrofarad, and the condenser $C_2$ of, for example, 150 micromicrofarad, wherein the latter condenser $C_2$ is designed in such a manner, that for the oscillator, the base electrode B is almost grounded for high frequency. The condenser $C_1$ is designed in such a manner, that it forms together with the coil $L_2$ a trap for blocking the intermediate frequency from the input to the stage. The tuned intermediate frequency circuit Z of, for example, 10.7 megacycles, comprising a coil $L_Z$ and capacitors $C_Z$, $C_Z'$, is connected to the collector K and shunted across the capacitively coupled oscillator circuit O via the condenser $C_Z$. This intermediate frequency circuit is inserted as a $\pi$-member to provide the required transformation to the input resistance of the following transistor $T_Z$, operating as an intermediate frequency amplifier.

In case of a circuit of the grounded base type, a capacitive coupling between the tuned circuits may be used in place of the above-described inductive coupling of the oscillating circuit with the feedback circuit, because in this case the capacitive coupling ensures the same phase relations between the voltages at the collector inductance $L_1$ and the inductance $L_2$. The control of the inductances is of no significance in this case, as the coils are no longer inductively coupled with each other.

Figure 6:
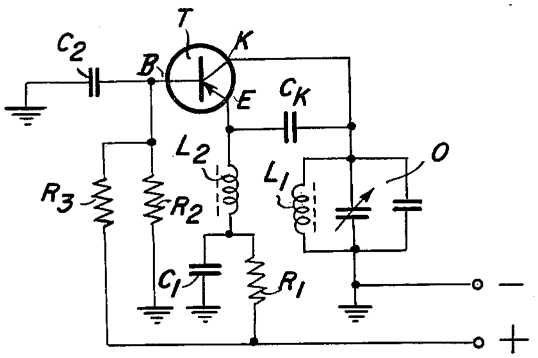
FIGURES 6 and 7 are diagrams showing modifications employing capacitive coupling of the oscillator circuit to the feedback circuit.

FIGURE 6 is an example of capacitive coupling in case of an oscillator according to FIGURE 2. The coupling capacity is denoted by $C_K$.

Figure 7:
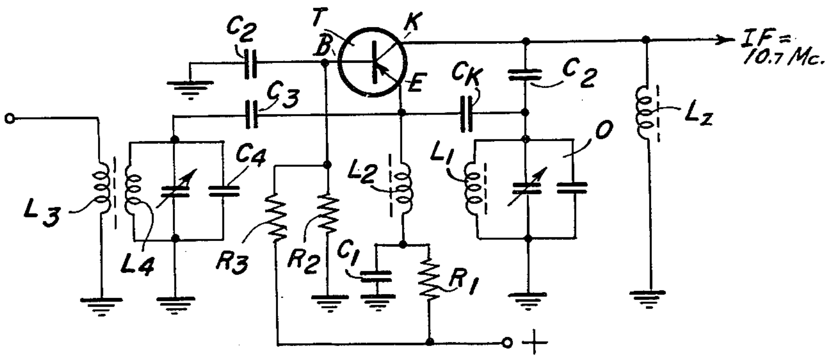

FIGURE 7 shows a self-oscillating mixing circuit according to FIGURE 6.

It is also possible to use combined inductive and capacitive coupling, for example, to obtain a certain frequency pass band, wherein the polarity of the inductive coupling has to be selected as in FIGURE 2, if the two couplings are to assist one another.

We claim:

1. A high-frequency oscillator circuit comprising, in combination: a transistor having an input circuit electrode, an output circuit electrode, and a substantially grounded electrode common to both circuits, said transistor having such characteristics that, at the high frequencies at which said oscillator circuit operates, the phase shift between the input voltage and the output current of said transistor is between −60° and −120°; power means for biasing said electrodes to provide gain between the input and output circuits; a frequency determining first parallel-resonant circuit connected with said output electrode; and a second parallel-resonant circuit connected with said input electrode, said parallel-resonant circuits being reactively coupled with each other in such a manner that the secondary voltage has a phase shift relative to the primary voltage, said second parallel-resonant circuit being tuned to the oscillator frequency if the transistor phase shift is −90° but, if the transistor phase shift deviates from −90°, being detuned in such direction and in such an amount corresponding to such deviation from −90° that the total phase shift in the feed-back path containing the two coupled circuits is 0° or 180°, whereby oscillation at maximum amplitude is attained.

2. A high-frequency oscillator circuit as defined in claim 1 wherein said input electrode is an emitter and said total phase shift in said feed-back path is 0°.

3. A high-frequency oscillator circuit as defined in claim 1 wherein said input electrode is a base and said total phase shift in said feed-back path is 180°.

4. A high-frequency oscillator circuit as defined in claim 1 wherein said parallel-resonant circuits are inductively coupled.

5. A high-frequency oscillator circuit as defined in claim 1 wherein said parallel-resonant circuits are capacitively coupled.

6. A high-frequency oscillator circuit as defined in claim 1 wherein said parallel-resonant circuits are both inductively and capacitively coupled.

7. A high-frequency oscillator circuit as defined in claim 1 wherein said second parallel-resonant circuit comprises the input capacitance of said transistor and an inductance connected at one end to said input circuit electrode and at the other end to said power means, said oscillator circuit further comprising a by-pass condenser between ground and said other end of said inductance.

8. A self-oscillating mixing stage for deriving an intermediate frequency, comprising a circuit according to claim 7, in combination with a radio signal coupling circuit connected with said oscillator input circuit, and said by-pass condenser and said inductance comprising a series tuned circuit resonant at said intermediate frequency.

9. A high frequency oscillator circuit as defined in claim 1, wherein said second parallel-resonant circuit comprises the input capacitance of said transistor and an inductance connected to said input circuit electrode.

References Cited in the file of this patent

UNITED STATES PATENTS

| | | |
|---|---|---|
| 2,811,643 | Eberhard | Oct. 29, 1957 |
| 2,816,220 | Goodrich | Dec. 10, 1957 |
| 2,855,568 | Lin | Oct. 7, 1958 |
| 2,878,376 | Stern | Mar. 17, 1959 |
| 2,880,312 | Koch | Mar. 31, 1959 |
| 2,887,573 | Hruska | May 19, 1959 |
| 2,939,000 | Krugman | May 31, 1960 |

OTHER REFERENCES

Angell and Keiper: "Circuit Applications of Surface Barrier Transistors," Proceedings of the I.R.E., December 1953, pages 1709–1712.